United States Patent
Gardner et al.

(10) Patent No.: US 9,967,104 B2
(45) Date of Patent: May 8, 2018

(54) DETECTING GROUND ISOLATION FAULT IN ETHERNET PODL SYSTEM

(71) Applicant: Linear Technology Corporation, Milpitas, CA (US)

(72) Inventors: Andrew J. Gardner, Santa Barbara, CA (US); Jeffrey L. Heath, Santa Barbara, CA (US)

(73) Assignee: Linear Technology Corporation, Milpitas, CA (US)

( * ) Notice: Subject to any disclaimer, the term of this patent is extended or adjusted under 35 U.S.C. 154(b) by 107 days.

(21) Appl. No.: 14/945,260

(22) Filed: Nov. 18, 2015

(65) Prior Publication Data

US 2016/0142217 A1    May 19, 2016

Related U.S. Application Data

(60) Provisional application No. 62/081,724, filed on Nov. 19, 2014.

(51) Int. Cl.
*H04L 25/08* (2006.01)
*H04L 12/10* (2006.01)
(Continued)

(52) U.S. Cl.
CPC ............ *H04L 12/10* (2013.01); *B60L 3/0069* (2013.01); *G01R 31/024* (2013.01); *H02H 3/16* (2013.01);
(Continued)

(58) Field of Classification Search
CPC .................................. H02H 3/16; H04B 3/544
See application file for complete search history.

(56) References Cited

U.S. PATENT DOCUMENTS

| | | | |
|---|---|---|---|
| 7,042,690 B2 * | 5/2006 | Male | G01R 31/025 361/103 |
| 7,426,374 B2 * | 9/2008 | Dwelley | H04L 12/10 370/436 |

(Continued)

FOREIGN PATENT DOCUMENTS

| | | |
|---|---|---|
| EP | 2442462 A2 | 4/2012 |
| WO | 2006127915 A2 | 11/2006 |

OTHER PUBLICATIONS

EPO as ISA, PCT/US2015/061661 filed Nov. 19, 2015, "International Search Report and Written Opinion," dated Mar. 18, 2016, 12 pages.

*Primary Examiner* — Jeffrey Zweizig
(74) *Attorney, Agent, or Firm* — Brian D. Ogonowsky; Patent Law Group LLP

(57) ABSTRACT

Circuits and techniques are described for detecting a ground fault leak between the PSE and the PD. Prior to PoDL voltage being applied to the PD, a test switch is temporarily closed for sensing a voltage drop in a loop between the positive terminal of the PSE voltage source and any ground leakage path between the PSE and the PD. If the resistance of the ground leakage path is below a certain threshold, a fault is declared. A similar test may be performed without a test switch by supplying a known test current through the loop and sensing the voltage drop. Another test is to connect the positive terminal of the PSE voltage source to the loop and sense the resulting current. After the full PoDL voltage is applied to the PD, a ground fault may be detected by sensing the equivalence between the source and return PSE currents.

11 Claims, 3 Drawing Sheets

(51) Int. Cl.
*G01R 31/02* (2006.01)
*H02H 3/16* (2006.01)
*H04L 12/26* (2006.01)
*H04L 12/24* (2006.01)
*B60L 3/00* (2006.01)
*H04L 12/40* (2006.01)

(52) U.S. Cl.
CPC ........ *H04L 12/40045* (2013.01); *H04L 25/08* (2013.01); *H04L 41/0681* (2013.01); *H04L 43/0811* (2013.01); *Y04S 40/166* (2013.01); *Y04S 40/168* (2013.01)

(56) References Cited

U.S. PATENT DOCUMENTS

| | | | |
|---|---|---|---|
| 7,586,840 B2* | 9/2009 | Karam | H04L 12/10 370/216 |
| 7,595,644 B2* | 9/2009 | Male | G01R 31/025 324/509 |
| 9,319,101 B2* | 4/2016 | Lontka | H04B 3/46 |
| 2013/0154348 A1* | 6/2013 | Hongo | H04B 3/54 307/1 |
| 2014/0136874 A1* | 5/2014 | Diab | H04L 12/40045 713/340 |
| 2015/0145324 A1* | 5/2015 | Heath | H04B 3/56 307/1 |
| 2015/0333935 A1* | 11/2015 | Gardner | H04L 25/0266 307/1 |
| 2016/0156173 A1* | 6/2016 | Gardner | H02H 3/202 361/91.5 |
| 2016/0337138 A1* | 11/2016 | Gardner | H04L 12/10 |

* cited by examiner

DETECTING GROUND ISOLATION FAULT IN ETHERNET PODL SYSTEM

CROSS-REFERENCE TO RELATED APPLICATIONS

This application claims priority to U.S. provisional application Ser. No. 62/081,724, filed Nov. 19, 2014, by Andrew J. Gardner and Jeffrey L. Heath.

FIELD OF THE INVENTION

This invention relates to Power over Data Lines (PoDL) systems, where power from a Power Sourcing Equipment (PSE) is transmitted to a Powered Device (PD) over a single wire pair that is also used for conducting differential data signals, typically Ethernet signals. The invention particularly relates to detecting ground isolation faults between the PSE and PD.

BACKGROUND

It is known to transmit Power over Data Lines to remote power equipment. Power over Ethernet (PoE) is an example of one such system. In PoE, limited power is transmitted to Ethernet-connected equipment (e.g., VoIP telephones, WLAN transmitters, security cameras, etc.) from an Ethernet switch. DC power from the switch is transmitted over two or more twisted wire pairs in the standard CAT-n cabling. One or more of the wire pairs also transmit differential data signals, since the DC common mode voltage does not affect the data. In this way, the need for providing any external power source for the Powered Devices (PDs) can be eliminated.

A newer technology is Power over Data Lines (PoDL) where power is transmitted over a single, twisted wire pair along with the differential data. As of the date of this disclosure, the IEEE is in the process of developing a standard for PoDL as IEEE 802.3bu. PoDL may be more flexible than PoE and, since it requires just one wire pair, is likely to become a popular technique, especially in automobiles.

It is envisioned that PoDL applications will require some manner of isolation between the PD ground and the PSE ground in order to prevent the formation of or minimize the effects of ground loops. The grounds are the respective reference nodes for the PSE and PD and are not necessarily absolute grounds or equal to each other. While failure of the PSE ground to PD ground isolation may not result in outright functional failure of the PoDL link, the resulting current flow (leakage current) may substantially degrade the integrity of the Ethernet data. Hence the ability to detect a failure in the isolation between the PD ground and PSE ground is important in order ensure data integrity in a PoDL Ethernet link.

SUMMARY

Circuits and techniques are described for detecting a ground fault leakage current between the PSE and the PD, both prior to the PoDL voltage being applied to the PD and after the PoDL voltage has been applied to the PD.

In one embodiment, prior to the PoDL voltage being applied to the PD, a fault test switch is temporarily closed to sense a voltage drop across a portion of the current loop between the positive terminal of the PSE voltage source and any ground leakage path between the PSE and the PD. If the resistance of the ground leakage path is below a certain threshold, a fault signal is generated.

In another embodiment, a similar test may be performed without a test switch by temporarily supplying a known test current through the current loop and sensing the voltage drop to determine if the resistance of the ground leakage path is below a certain threshold.

In another embodiment, the positive terminal of the PSE voltage source is temporarily connected to the current loop and the resulting current is sensed.

Other circuits are described.

To detect a ground isolation fault between the PSE and the PD after the full PoDL voltage is applied to the PD, the source and return PSE currents are sensed, differenced, and compared against a window in order to detect a ground isolation fault while the link is powered.

BRIEF DESCRIPTION OF THE DRAWINGS

Elements that are the same or equivalent in the various figures are labeled with the same numeral.

DETAILED DESCRIPTION

Various PoDL systems are described that include circuitry for detecting a ground isolation fault between the PSE and PD. Generally, such a ground fault creates an unintended current path (a loop) between the PD's negative reference voltage terminal and the PSE's ground terminal. The amount of such leakage is detected by the disclosed circuits and, if the leakage is above a certain threshold, a ground fault is declared. This fault signal may then be used to disable the PoDL system since the Ethernet data may be compromised.

Conventional aspects of a PoDL will first be described with respect to FIG. 1.

Figure 1:
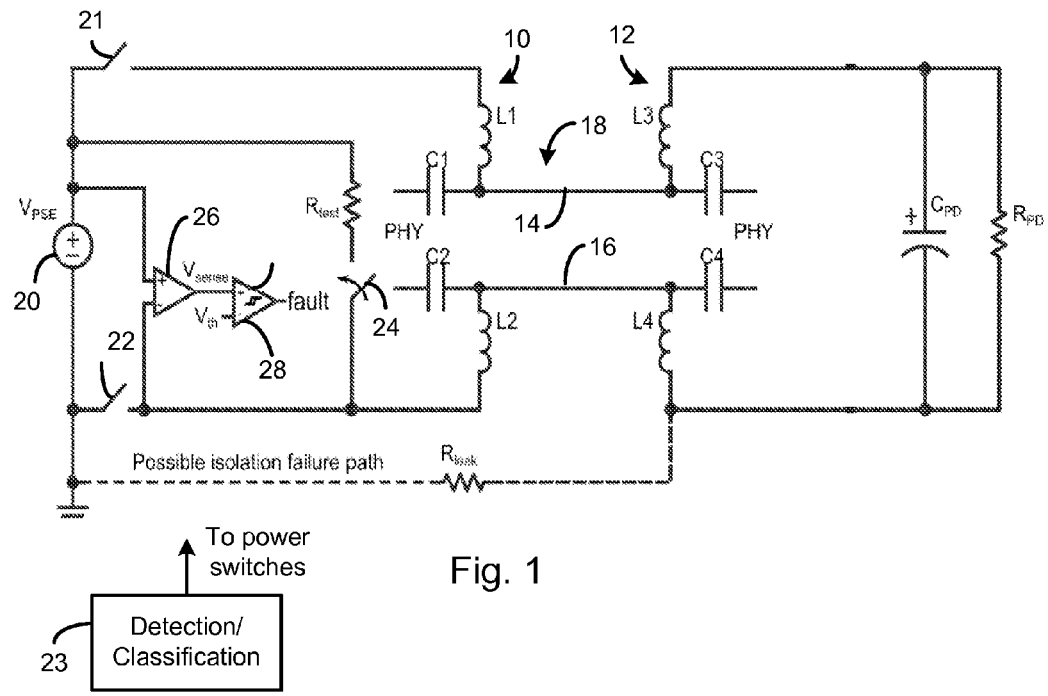
FIG. 1 illustrates a PoDL system that includes circuitry for detecting a ground isolation fault between the PSE and PD, prior to the PoDL voltage being applied to the PD, in accordance with a first embodiment of the invention.

FIG. 1 illustrates the pertinent portion of a PSE 10 and a PD 12 connected via a first wire 14 and a second wire 16 in a twisted wire pair 18.

A coupling/decoupling network comprises capacitors C1-C4 and inductors L1-L4. The relatively high frequency Ethernet differential data is passed by the capacitors C1-C4 while the inductors L1-L4 block the data signals. The Ethernet transceivers are referred to as PHYs, which are the physical layers in the data path. The data is processed by conventional equipment not shown in the figures.

The PoDL DC voltage that powers the PD 12 is generated by a PSE voltage source 20 generating the voltage $V_{PSE}$. Once the power switches 21 and 22 are closed, the DC voltage is coupled to the wire pair 18 by the inductors L1 and L2, and the DC voltage is coupled to the PD load, represented by the resistor $R_{PD}$, via the decoupling inductors L3 and L4. The capacitors C1-C4 block the DC voltage. A capacitor $C_{PD}$ smooths the DC voltage.

Typically, in a PoDL system, a low power detection and classification routine is performed that detects whether the PD is PoDL-compatible and conveys the power requirements of the PD. This low power routine will be referred to as handshaking and is described in the IEEE standards for PoDL. Such a routine may be carried out by a state machine, a processor, or other known circuits and is represented by the Detection/Classification circuit 23.

Prior to a successful handshaking, power switches 21 and 22 between the PSE voltage source 20 and the twisted wire pair 18 are open. After a successful handshaking, the power switches 21 and 22 are closed to supply the full PoDL voltage $V_{PSE}$ to the PD 12.

It is possible that the negative terminal of the PD 12 can be shorted to the ground of the PSE 10 or have some other level of leakage to the ground of the PSE 10. Such current leakage between the negative terminal of the PD 12 and the ground of the PSE 10 may substantially degrade the integrity of the Ethernet data. Therefore, it is important that a ground isolation fault is identified if the current leakage is near a level where the Ethernet data becomes unreliable.

Three possible scenarios exist for detecting ground fault current leakage loops between the PSE and PD in Ethernet PoDL: 1) detection prior to the application of PoDL power to the PD; 2) detection in the presence of PoDL power being applied to the PD; or 3) both.

FIGS. 1-5 illustrate alternative circuitry and schemes for detecting a ground isolation fault prior to the PoDL voltage being applied to the PD 12.

In FIG. 1, after start-up but prior to the power switches 21 and 22 being closed, a fault test switch 24 is temporarily closed to couple a pull-up test resistor $R_{test}$ between the positive terminal of the PSE voltage source 20 and the inductor L2. The voltage across the test resistor $R_{test}$ is sensed by a differential amplifier 26, which outputs a voltage sense signal $V_{sense}$. $V_{sense}$ is then compared to a fixed voltage threshold $V_{th}$ by a hysteresis comparator 28. If $V_{sense}$ is greater than $V_{th}$, taking into account the hysteresis, a ground isolation fault signal is generated. This fault signal may then be used to signal that the system needs servicing to fix the ground isolation fault. The fault signal may also disable the system to prevent the power switches 21 and 22 being closed.

The ground isolation leakage resistance is represented by the resistance $R_{leak}$. The lower the $R_{leak}$ resistance, the more current leakage there is between the PD 12 ground and the PSE 10 ground. When the fault test switch 24 is closed, a current loop is created by the resistor $R_{test}$, inductor L2, wire 16, inductor L4, and $R_{leak}$ to the PSE 10 ground. Resistances $R_{test}$ and $R_{leak}$ form a voltage divider in the leakage current loop.

The $V_{sense}$ is given by $V_{sense}=V_{PSE} \times R_{test}/(R_{test}+R_{leak})$, assuming there is negligible resistance from inductors L2, L4, and wire 16. As the value of $R_{leak}$ decreases, the value of $V_{sense}$ will increase to a maximum value of $V_{PSE}$ in the event of a full ground short. By comparing $V_{sense}$ against the threshold voltage $V_{th}$, set between $V_{PSE}$ and 0V, it is detected when the leakage resistance $R_{leak}$ between PSE ground and the negative voltage PD terminal has decreased below a critical value. The critical value may be determined by the leakage resistance needed to sufficiently degrade the Ethernet data. The fault signal is then asserted. The fault signal may disable the power switches 14 and 16 from being turned on.

If the resistance from inductors L2 and L4 and wire 16 is substantial, this needs to be taken into account when selecting the acceptable level of $V_{sense}$.

Additional embodiments for test and measurement of the leakage path resistance or current between the PD and PSE with open PSE source and return power switches 21 and 22 are illustrated in FIGS. 2-5.

Figure 2:
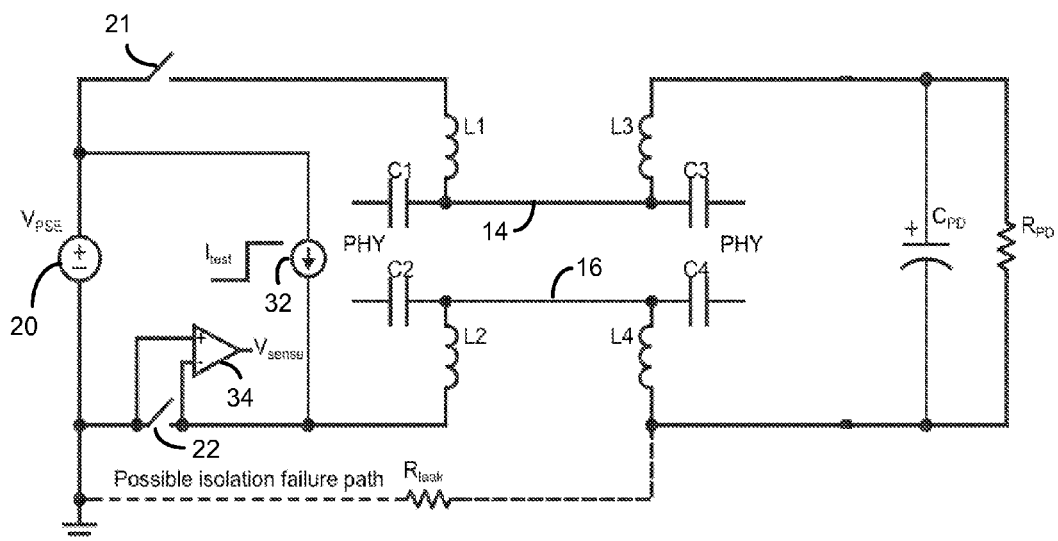
FIG. 2 illustrates a PoDL system that includes circuitry for detecting a ground isolation fault between the PSE and PD, prior to the PoDL voltage being applied to the PD, in accordance with a second embodiment of the invention.

In FIG. 2, a fault test current source 32, connected between the positive terminal of the voltage source 20 and the inductor L2, is temporarily turned on to supply a fixed current through the current loop created by inductor L2, wire 16, inductor L4, and $R_{leak}$ to the PSE ground. The voltage drop across the series combination of the resistance $R_{leak}$, inductors L2 and L4, and wire 16 is detected by a differential amplifier 34 to generate a voltage sense signal $V_{sense}$ having a known relationship to the value of $R_{leak}$. $V_{sense}$ is then applied to a hysteresis comparator for comparison to a threshold voltage, in the manner shown in FIG. 1, to generate a fault signal if the value of $R_{leak}$ is below a threshold value.

Figure 3:
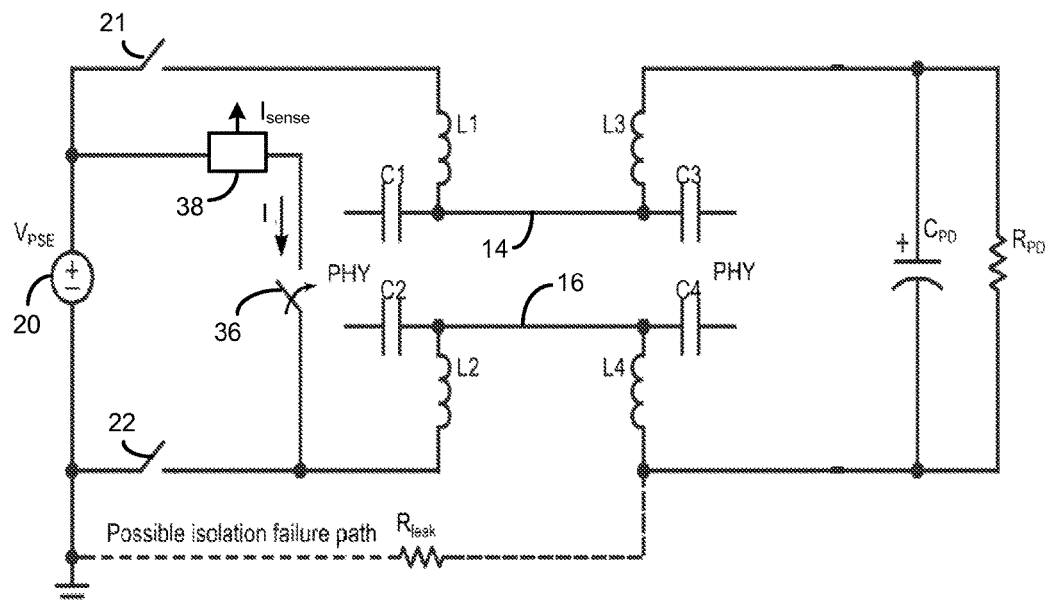
FIG. 3 illustrates a PoDL system that includes circuitry for detecting a ground isolation fault between the PSE and PD, prior to the PoDL voltage being applied to the PD, in accordance with a third embodiment of the invention.

FIG. 3 illustrates an embodiment that directly senses the leakage current between the positive terminal of the voltage source 20 and the PSE ground, via the inductors L2 and L4, wire 16, and resistance $R_{leak}$, when a fault test switch 36 is temporarily closed prior to the power switches 21 and 22 being turned on. The current $I_{sense}$ may be sensed by a low value sense resistor in series with the current path, where the voltage drop across the sense resistor is related to the current. Such a conventional current sense circuit is represented by the current sense circuit 38 that outputs the value $I_{sense}$. A voltage corresponding to $I_{sense}$ is then compared to a threshold voltage, in the same manner shown in FIG. 1, and a fault signal is asserted by the comparator if the leakage current is above a threshold that would sufficiently degrade the Ethernet data.

Figure 4:
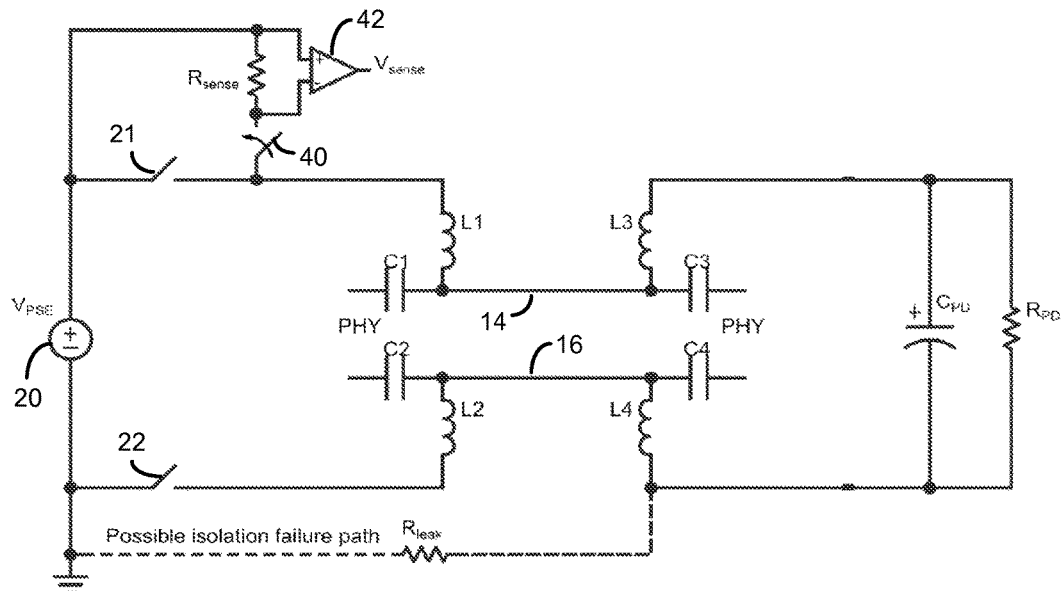
FIG. 4 illustrates a PoDL system that includes circuitry for detecting a ground isolation fault between the PSE and PD, prior to the PoDL voltage being applied to the PD, in accordance with a fourth embodiment of the invention.

FIG. 4 illustrates an embodiment where the positive terminal of the PSE voltage source 20 is coupled to the inductor L1 and wire 14, via a sense resistor $R_{sense}$, when a fault test switch 40 is temporarily closed when the power switches 21 and 22 are open. The current loop between the positive terminal and the PSE ground is therefore through the sense resistor $R_{sense}$, inductor L1, wire 14, inductor L3, the PD load $R_{PD}$, and the ground fault resistance $R_{leak}$. The voltage drop across the sense resistor $R_{sense}$ is detected by a differential amplifier 42 to generate $V_{sense}$, and $V_{sense}$ is compared to a threshold voltage, in the manner shown in FIG. 1, to determine whether a fault signal is to be asserted.

Figure 5:
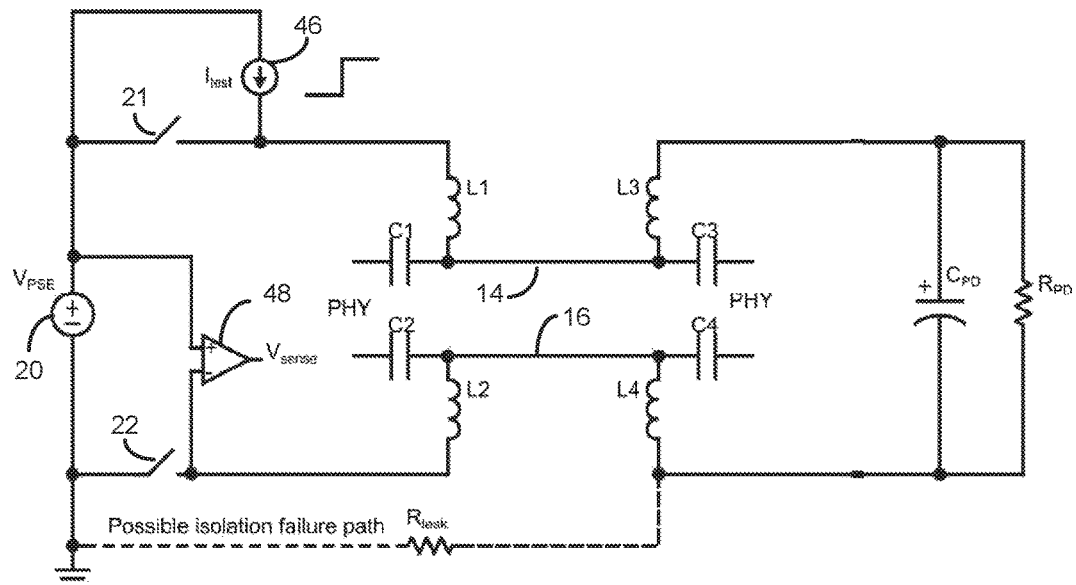
FIG. 5 illustrates a PoDL system that includes circuitry for detecting a ground isolation fault between the PSE and PD, prior to the PoDL voltage being applied to the PD, in accordance with a fifth embodiment of the invention.

FIG. 5 illustrates an embodiment where a current source 46, coupled to the positive terminal of the voltage source 20, is temporarily turned on to supply a fixed current $t_{test}$ through a first current loop, comprising inductor L1, wire 14, inductor L3, the PD load $R_{PD}$, and the ground fault resistance $R_{leak}$, and simultaneously through a second current loop that includes inductor L4, wire 16, and inductor L2.

If the ground isolation leakage resistance $R_{leak}$ is high (e.g., an open circuit), all current will flow through the second loop that includes inductor L4, wire 16, and inductor L2. As a result, the voltage difference at the inputs to the differential amplifier 48 will be primarily determined by the voltage drop across the PD load $R_{PD}$ and will be an expected value. The value of $V_{sense}$ is then compared to a threshold value, in the manner shown in FIG. 1, and no fault signal will be asserted. However, if there is substantial leakage current through the resistance $R_{leak}$, the first current loop will draw a leakage current, and the voltage difference at the inputs of the differential amplifier 48 will cause $V_{sense}$ to be greater than the threshold value to cause a fault signal to be asserted.

After a successful fault test and the handshaking routine, the power switches 21 and 22 are closed to supply the full $V_{PSE}$ to the PD load $R_{PD}$.

A different approach for sensing leakage paths in shunt with the PoDL wire pair 18 is required for the case where the PSE power switches 21 and 22 are closed and the link is already powered.

Figure 6:
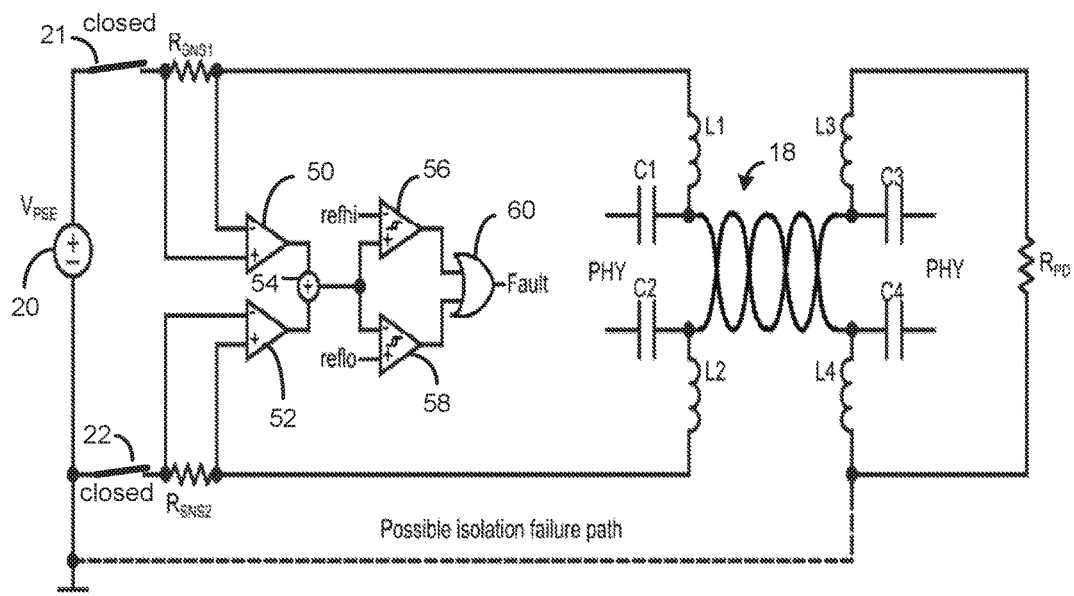
FIG. 6 illustrates a PoDL system that includes circuitry for detecting a ground isolation fault between the PSE and PD, after the PoDL voltage has been applied to the PD, in accordance with a sixth embodiment of the invention.

FIG. 6 illustrates a PoDL circuit where the source and return PSE currents are simultaneously sensed, differenced, and compared against an acceptable difference in order to detect a ground isolation fault while the link is powered. The power switches 21 and 22 are shown closed. The PD load $R_{PD}$ is being powered by the voltage source 20. The fault detection circuit is always operating.

Low value sense resistors $R_{SNS1}$ and $R_{SNS2}$ of equal value are in series with the source and return current paths. During normal operation, the PD load currents through both sense resistors are approximately equal if there is no ground isolation leakage. The voltage drops across the sense resistors are amplified by the differential amplifiers 50 and 52. If the source and return currents are equal, the outputs of the differential amplifiers 50 and 52 will be equal. The outputs of the differential amplifiers 50 and 52 are subtracted by a subtractor 54 to generate a signal representing the difference between the source current and return current. The output of the subtractor 54 is compared, via hysteresis comparators 56 and 58, to a high reference voltage refhi and a low reference voltage reflo, which represent an acceptable range of the difference. If the difference is within the acceptable range, both comparators 56/58 will output a logical zero, and there will be no fault issued. The comparators 56/58 may be referred to as a window comparator.

If there is a significant ground isolation leakage current, the return current through the sense resistor $R_{SNS2}$ will be less than the source current through the sense resistor $R_{SNS1}$, so the output of the differential amplifier 52 will be lower than the output of the differential amplifier 50. As a result, the output of the subtractor 54 may be higher than refhi, causing the comparator 56 to output a logical one. The OR gate 60 then asserts the fault signal. A fault signal is also asserted if the output of the subtractor 54 is below the level reflo due to a leakage path in shunt with the positive conductor of the wire pair.

A similar detection circuit may be used by reversing the inverting and non-inverting inputs of one of the differential amplifiers 50 and 52 and using a summer instead of a subtractor to detect the difference between the source current and return current.

Various other circuits and schemes may be used that are related to the embodiments described above.

While particular embodiments of the present invention have been shown and described, it will be obvious to those skilled in the art that changes and modifications may be made without departing from this invention in its broader aspects and, therefore, the appended claims are to encompass within their scope all such changes and modifications.

The invention claimed is:

1. A Power over Data Lines (PoDL) system, the system including Power Sourcing Equipment (PSE) configured for being coupled to a Powered Device (PD) via a wire pair, the PSE also being configured for coupling a DC voltage to the wire pair via one or more power switches so that differential data signals and DC power can be conducted over the same wire pair, the PSE comprising:
   a sense circuit coupled to sense a leakage current in a current loop, wherein the current loop includes at least one wire in the wire pair between the PSE and PD, wherein the leakage current is indicative of a ground isolation fault between the PD and a ground of the PSE, wherein the sense circuit is configured to identify if the sensed leakage current indicative of the ground isolation fault is above a threshold value;
   wherein the sense circuit comprises:
      a first current sensing circuit configured to sense a sourcing current level to a PD load when the one or more power switches are closed, the first current sensing circuit comprising a first differential amplifier outputting a first signal indicative of the sourcing current level;
      a second current sensing circuit configured to sense a return current level from the PD load when the one or more power switches are closed, the second current sensing circuit comprising a second differential amplifier outputting a second signal indicative of the return current level;
      a detector circuit configured to detect signals corresponding to the sourcing current level and the return current level and determining if the return current is sufficiently changed by a leakage current to signal the ground isolation fault, the detector circuit comprising:
         a combiner coupled to receive the first signal and the second signal; and
         a comparator that determines whether an output of the combiner indicates the ground isolation fault.

2. The system of claim 1 where the combiner comprises a summer.

3. The system of claim 1 where the combiner comprises a subtractor.

4. The system of claim 1 wherein the comparator comprises a window comparator.

5. The system of claim 1 wherein the comparator determines whether the output of the combiner indicates that a leakage path is present in shunt with a positive conductor in the wire pair.

6. A method performed in a Power over Data Lines (PoDL) system comprising:
   supplying a DC voltage from Power Sourcing Equipment (PSE) to a Powered Device (PD) via a wire pair, wherein differential data signals and DC power are conducted over the same wire pair;
   sensing, via a sense circuit, a leakage current in a current loop, wherein the current loop includes at least one wire in the wire pair between the PSE and PD, wherein the leakage current is indicative of a ground isolation fault between the PD and a ground of the PSE, wherein the sense circuit identifies if the sensed leakage current indicative of the ground isolation fault is above a threshold value;
   wherein the sensing comprises:
      sensing, via a first current sensing circuit, a sourcing current level to a PD load, the first current sensing circuit comprising a first differential amplifier outputting a first signal indicative of the sourcing current level;

sensing, via a second current sensing circuit, a return current level from the PD load, the second current sensing circuit comprising a second differential amplifier outputting a second signal indicative of the return current level;

detecting, via a detector circuit, signals corresponding to the sourcing current level and the return current level and determining if the return current is sufficiently changed by a leakage current to signal the ground isolation fault, wherein the detecting comprises:

combining the first signal and the second signal to generate a combined signal; and comparing the combined signal to a threshold to determine whether the combined signal indicates the ground isolation fault.

7. The method of claim 6 where combining the first signal and the second signal comprises summing the first signal and the second signal.

8. The method of claim 6 where combining the first signal and the second signal comprises determining a difference between the first signal and the second signal.

9. The method of claim 6 where comparing the combined signal to the threshold comprises using a window comparator to compare the combined signal to the threshold.

10. The method of claim 6 wherein the comparing determines whether the combined signal indicates that a leakage path is present in shunt with a positive conductor in the wire pair.

11. A Power over Data Lines (PoDL) system comprising:
a means for supplying a DC voltage from Power Sourcing Equipment (PSE) to a Powered Device (PD) via a wire pair, wherein differential data signals and DC power are conducted over the same wire pair;

a means for sensing a leakage current in a current loop, wherein the current loop includes at least one wire in the wire pair between the PSE and PD, wherein the leakage current is indicative of a ground isolation fault between the PD and a ground of the PSE, wherein the means for sensing the leakage current identifies if the sensed leakage current indicative of the ground isolation fault is above a threshold value;

wherein the means for sensing the leakage current comprises:

a means for sensing a sourcing current level to a PD load comprising a first differential amplifier outputting a first signal indicative of the sourcing current level;

a means for sensing a return current level from the PD load comprising a second differential amplifier outputting a second signal indicative of the return current level;

a means for detecting signals corresponding to the sourcing current level and the return current level and determining if the return current is sufficiently changed by a leakage current to signal the ground isolation fault, wherein the means for detecting signals comprises:

a means for combining the first signal and the second signal to generate a combined signal; and a means for comparing the combined signal to a threshold to determine whether the combined signal indicates the ground isolation fault.

* * * * *